(12) United States Patent
Hara et al.

(10) Patent No.: US 6,414,387 B1
(45) Date of Patent: Jul. 2, 2002

(54) SEMICONDUCTOR DEVICE INCLUDING A CHIP HAVING HIGH-FREQUENCY CIRCUIT BLOCKS

(75) Inventors: Shinji Hara, Nara; Hiroyuki Asano, Ikoma, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/571,659

(22) Filed: May 15, 2000

(30) Foreign Application Priority Data

Sep. 20, 1999 (JP) .......................................... 11-265892

(51) Int. Cl.⁷ .............................................. H01L 23/52
(52) U.S. Cl. ....................................... 257/691; 257/692
(58) Field of Search ................................. 257/691, 692, 257/503, 784

(56) References Cited

U.S. PATENT DOCUMENTS

| 4,686,492 A | * | 8/1987 | Grellmann et al. ............ 29/829 |
| 5,606,196 A | | 2/1997 | Lee et al. .................... 257/503 |

FOREIGN PATENT DOCUMENTS

| EP | 2-107001 A | 4/1990 |
| JP | 3-262302 A | 11/1991 |
| JP | 6-275771 | 9/1994 |

OTHER PUBLICATIONS

Yun et al., "Parasitic Impedance Analysis of Double Bonding Wires for High–Frequency Integrated Circuit Packaging", IEEE Microwave and Guided Wave Letters, U.S., IEEE Inc., New York, vol. 5, No. 9, Sep. 1, 1995, pp. 296–298.

Lee, "Wideband Characterization of Mutual Coupling Between High Density Bonding Wires", IEEE Microwave and Guided Wave Letters, U.S., IEEE, Inc., New York, vol. 4, No. 8, Aug. 1, 1994, pp. 265–267.

Benton, "Ribbon Bonding", Advanced Packaging, U.S., IHS Publishing Group, vol. 8, No. 3, Mar. 1999, pp. 24–26.

Blair, "LDMOS Devices Provide High Power for Digital PCS", Applied Microwave & Wireless, Oct. 1998, pp. 84–88.

* cited by examiner

Primary Examiner—Phat X. Cao
(74) Attorney, Agent, or Firm—Nixon & Vanderhye P.C.

(57) ABSTRACT

A semiconductor device includes a high-frequency-use semiconductor chip having high frequency circuit blocks. The semiconductor chip is mounted on a circuit substrate and electrical connectors are provided for electrically connecting each one of the high frequency circuit blocks in the semiconductor chip to the circuit substrate. The electrical connectors situated adjacent to each other are provided such that the distance between first contacts at which the electrical connectors are electrically connected to the respective high frequency circuit blocks is smaller than the distance between second contacts at which the electrical connectors are electrically connected to the circuit substrate.

36 Claims, 7 Drawing Sheets

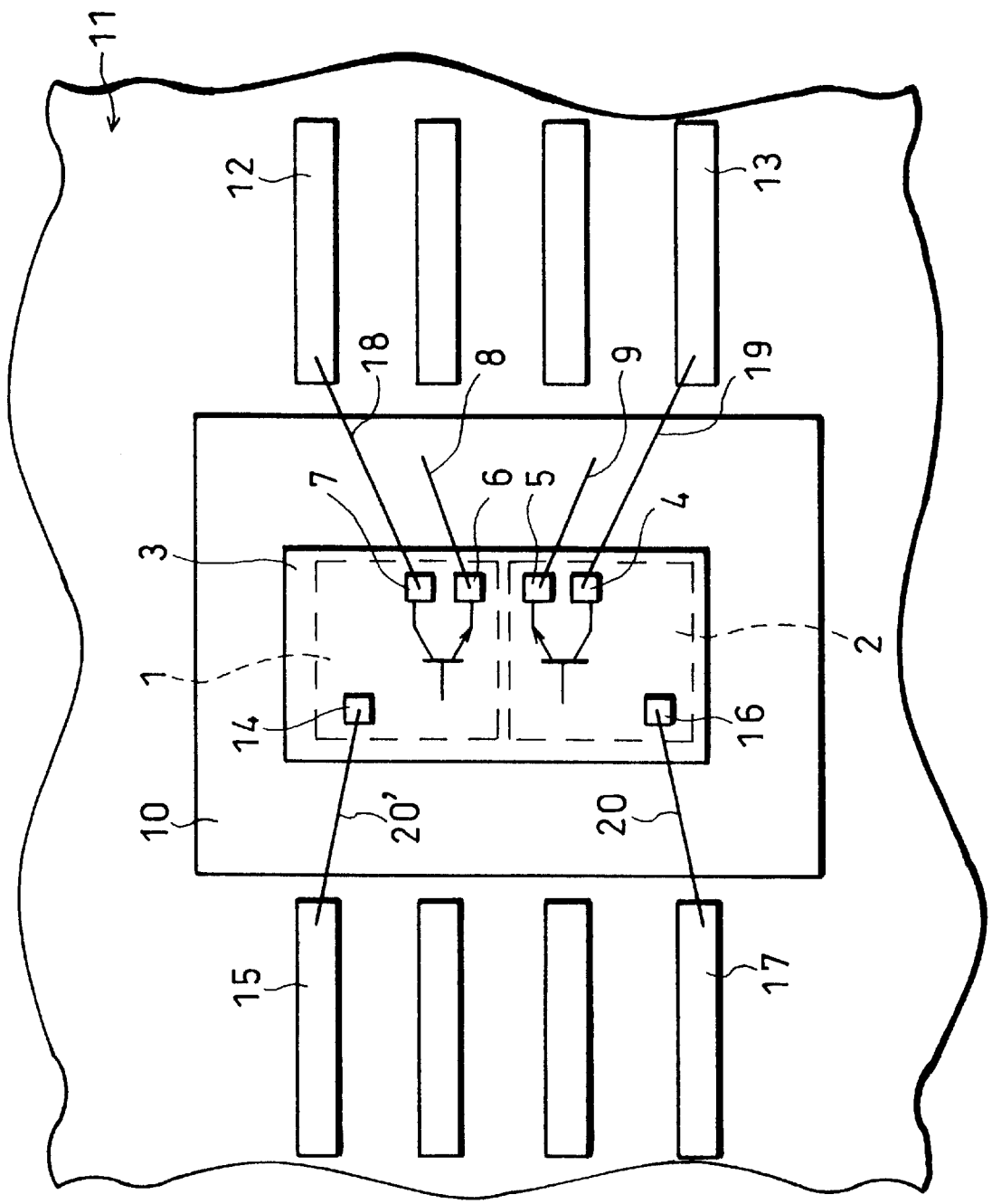

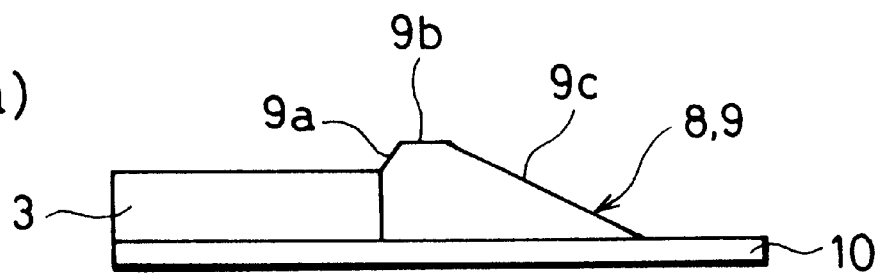
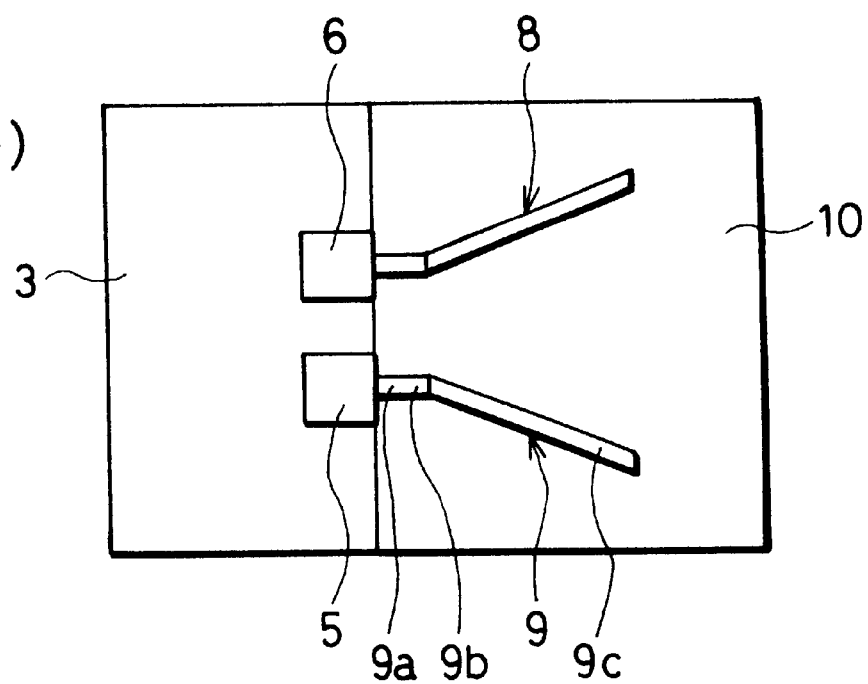

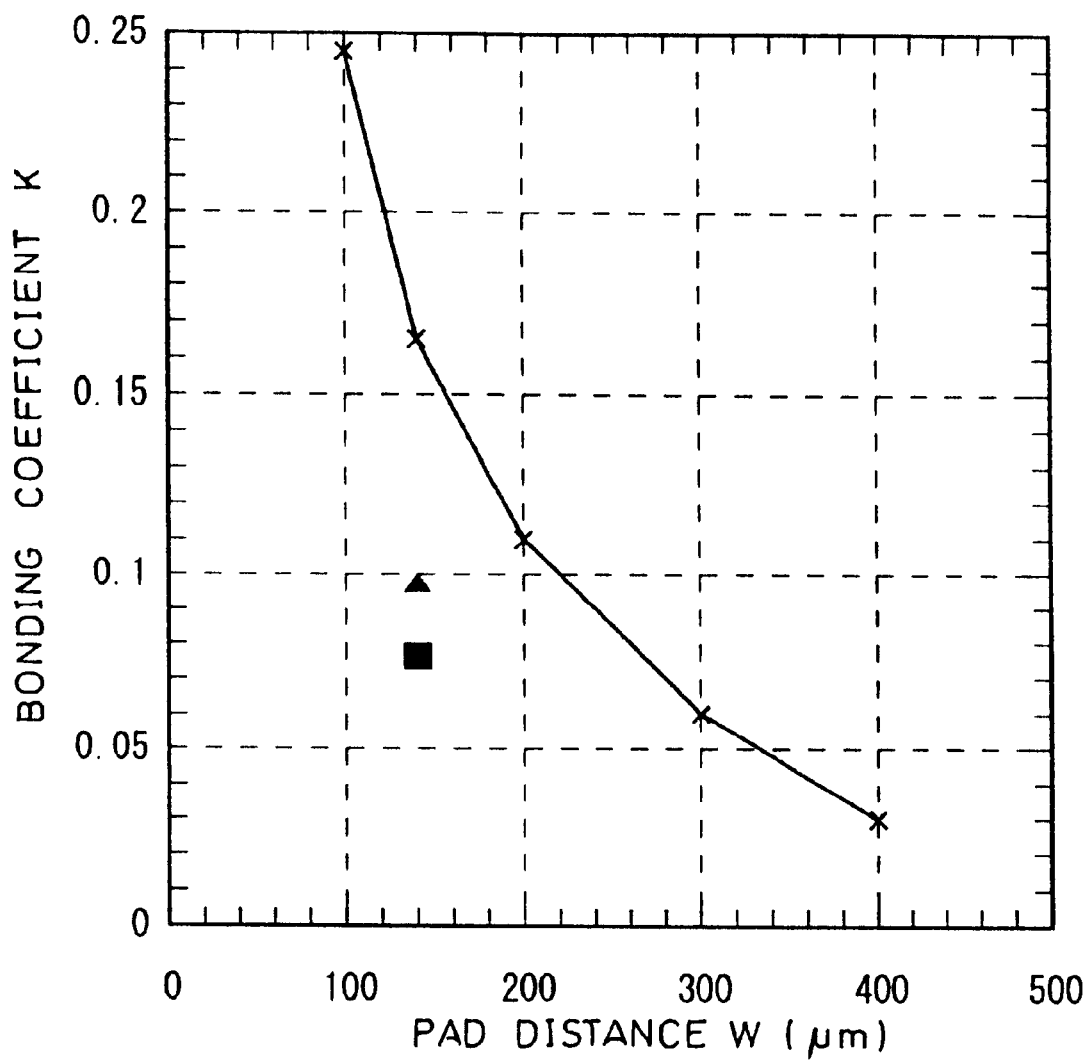

SEMICONDUCTOR DEVICE INCLUDING A CHIP HAVING HIGH-FREQUENCY CIRCUIT BLOCKS

FIELD OF THE INVENTION

The present invention relates to semiconductor devices capable of sufficiently maintaining high frequency properties of high frequency semiconductor chips that operate at high frequencies, especially, in the gigahertz band.

BACKGROUND OF THE INVENTION

In recent years, demand has been growing for integrated circuits capable of operating at microwaves and milliwaves, in response to wide-spread use of mobile telecommunications systems such as PHSs (Personal Handy Phone System) and PDCs (Personal Digital Cellular Phone). Thus, Si and GaAs transistors have been developed for use in such integrated circuits, which in turn led to on-going development of highly integrated MMICs (Monolithic Microwave Integrated Circuits), such as power amplifiers, mixers, and low noise amplifiers, incorporating those transistors.

In an integrated circuit operating in a high frequency band, the stray inductance in wires grows beyond ignorable level. The stray inductance, in some cases, drastically degrades properties of the integrated circuit, especially, those properties in GHz range.

For example, to package or mount a semiconductor chip including a high frequency circuit on a circuit substrate, bonding wires are used so as to electrically connect the semiconductor chip to the package or circuit substrate. In that situation, the effect of the inductance of the bonding wires is extremely strong: the degradation in the intrinsic performance (especially, high frequency properties) of the circuit in the semiconductor chip is inevitable unless the inductance is reduced sufficiently.

Specifically, the effect of the inductance of the bonding wires as signal lines extending from the semiconductor chip can be reduced by matching impedances with an externally connected load circuit; however, such matching is impossible on the inductance of, especially, grounded bonding wires, which end up in behaving as a feedback circuit. Thus, the inductance reduces the gain introduced by the amplifier circuit in the semiconductor chip, and degrades properties, especially in high frequency band.

So, the problem here is how to minimize the inductance when the ground line in, for example, a gallium arsenide (GaAs) semiconductor chip for use at high frequencies is connected to an external ground line or ground surface, such as the package or the circuit substrate, so as to mount the semiconductor chip.

Conventionally, there are two kinds of techniques used popularly to reduce the inductance. One of them is to shorten the bonding wires to a minimal possible extent so as to reduce their inductance.

A typical example of techniques of this kind is described for use in mounting in "LDMOS Devices Provide High Power for Digital PCS", Applied Microwave & Wireless, pp. 84–88, October (1988), by Cindy Blair.

In the course of mounting, a semiconductor chip is placed on a ground electrode, and bonding wires are positioned in parallel to each other and perpendicular to the sides of a high-frequency-use semiconductor chip, to minimize the length of, especially, the grounded bonding wires. Shown in FIG. 5 is a schematic illustration of this mounting technique.

To further explain the mounting, as shown in FIG. 5, there is provided a package 80 including a ground electrode 81 for the package 80, as well as input electrodes (lead frame serving as input terminals) 85 for the package 80 and output electrodes 86 for the package 80 disposed in proximity to the ground electrode 81.

A semiconductor chip 71 disposed on the ground electrode 81 includes thereon a ground terminal 84 for ground use, input terminals 75 for the semiconductor chip 71, and output terminals 76 for the semiconductor chip 71.

The terminals 75, 76, and 84 of the semiconductor chip 71 are electrically connected respectively to the electrode 85, 86, and 81 of the package 80 by bonding wires 73, 83, and 82.

Japanese Laid-Open Patent Application No. 2-107001/1990 (Tokukaihei 2-107001; published on Apr. 19, 1990), Japanese Laid-Open Patent Application No. 3-262302/1991 (Tokukaihei 3-262302; published on Nov. 22, 1991), etc. disclose another known technique to shorten the bonding wires whereby the bonding pads are positioned at the same height with the pattern surface of the substrate by arranging the chip so that the chip is connected to the bonding wires at places lower than the rest of the chip; hence, the bonding wires connecting the bonding pads to the pattern surface has a reduced length and a reduced inductance.

Another technique is known that shortens the wires in their entirety, including the bonding wires, whereby the high-frequency-use semiconductor chip is provided with a small hole through which the ground line inside the chip is connected to the external ground surface on the back of the semiconductor chip.

Apart from the foregoing kind of techniques to shorten the bonding wires, another kind of technique is known to reduce the mutual inductance, whereby the bonding wires extending from the ground line inside the semiconductor chip are provided in a maximum number possible and connect to the lead frame or to the slag right beneath the chip, so as to mount, and electrically connect, the high-frequency-use semiconductor chip to the package by wireless bonding. The technique is to connect a plurality of bonding wires having an inductance in parallel to each other so as to reduce the total inductance.

Incidentally, development in high integration of high-frequency-use semiconductor chips and increasing demand for smaller and cheaper circuits have resulted in a growing trend of a single high-frequency-use semiconductor chip incorporating circuits that have been conventionally offered as separately packaged high-frequency-use semiconductor chips. Shown in FIG. 6 as an example is a schematic illustration of a high-frequency-use power amplifier (hereinafter, will be simply referred to as an amplifier circuit) 21 and an amplifier circuit 22 that are integrated into a single chip. As shown in FIG. 6, a high-frequency-use semiconductor chip 23 is constituted by an amplifier circuit 21 and an amplifier circuit 22 (FIG. 6 only shows a bipolar transistor in the output stage).

The amplifier circuit 21 includes an output bonding pad 27 for the amplifier circuit 21, a ground-use bonding pad 26 for the amplifier circuit 21, and an input bonding pad 34 for the amplifier circuit 21. The output bonding pad 27 is connected to, for example, the collector terminal of the high-frequency-use bipolar transistor, whereas the ground-use bonding pad 26 is connected to, for example, the emitter terminal of the high-frequency-use bipolar transistor.

Similarly, the amplifier circuit 22 includes an output bonding pad 24 for the amplifier circuit 22, a ground-use bonding pad 25 for the amplifier circuit 22, and an input bonding pad 36 for the amplifier circuit 22. The output bonding pad 24 is connected to, for example, the collector terminal of the high-frequency-use bipolar transistor, whereas the ground-use bonding pad 25 is connected to, for example, the emitter terminal of the high-frequency-use bipolar transistor.

Further, a package 31 as the circuit substrate includes output terminals 32 and 33 for the package 31 to receive outputs from the amplifier circuits 21 and 22 respectively and input terminals 35 and 37 for the package 31 to supply inputs to the amplifier circuits 21 and 22 respectively, as well as a ground electrode 30 which serves as a frame to which the high-frequency-use semiconductor chip 23 is mounted and which also serves as a ground surface.

Then, bonding wires 50, 41, 38, 39, 28, 29 electrically connect the bonding pads 34, 36, 27, 24, 26, and 25 on the semiconductor chip 23 to the terminals (lead frame) 35, 37, 32, 33, and 30 of the package 31 respectively so as to electrically interconnect the semiconductor chip 23 to the package 31. Among those bonding wires, the bonding wires 28 and 29 serve so as to ground the amplifier circuits 21 and 22. In addition, the bonding wires 28 and 29 are positioned in parallel to each other and perpendicular to a side of the semiconductor chip 23.

The explanation in the following will focus on the operation of the circuits in the high-frequency-use semiconductor chip 23. The two amplifier circuits 21 and 22 are used under such conditions that the amplifier circuit 22 is turned off when the amplifier circuit 21 is in operation, and conversely, the amplifier circuit 21 is turned off when the amplifier circuit 22 is in operation. Consequently, in an ideal state, when the amplifier circuit 21 is activated, the amplifier circuit 22 is isolated, that is, the output terminal 33 of the package 31 does not offer passage to high frequency current, let alone to d.c. current.

However, in the foregoing conventional example, especially in a situation such that the bonding wires 28 and 29 through which amplified output signals are transmitted are positioned in close proximity to each other, the bonding pads 26 and 25 are spaced apart by a distance of 140 $\mu$m, and the bonding wires 28 and 29 are 728 $\mu$m long for example, simulation with a commercially available electromagnetic field simulator and subsequent computation gave a bonding coefficient K=0.16 for the inductance.

The electromagnetic bonding causes the ground potential (emitter potential) of the bonding pad 25 on the chip containing the amplifier circuit 22 to vary at high frequencies. If the magnitude of the variation grows, the amplifier circuit 22, which should not operate, may be turned on in some cases due to the high frequency (intermittent) variation. When this is the case, a current flow appears at the output terminal 33. To put the problem in different terms, the output signal from the amplifier circuit 21 leaks and appears at the output terminal 33 connected to the amplifier circuit 22. The problem is possibly a cause for a worst scenario: there occurs oscillation, which obstructs normal operation of, and possibly destroy, the high-frequency-use semiconductor chip 23.

The problem can be solved by forming the amplifier circuits 21 and 22 from individual high frequency semiconductor chips and spacing the amplifier circuits 21 and 22 apart from each other by such a distance that the amplifier circuits 21 and 22 do not interfere with the operation of each other, or by integrating the amplifier circuits 21 and 22 in a single chip but spacing the amplifier circuits 21 and 22 sufficiently apart from each other in that chip.

Such solutions, however, have drawbacks: an increased number of steps required in mounting and an increased overall size of the chip. This in turn constitutes an obstacle in development of cheaper and smaller chips.

As mentioned above, conventional techniques exist to further shorten the bonding wires: the bonding pads are positioned at the same height with the pattern surface of the substrate by arranging the chip so that the chip is connected to the bonding wires at places lower than the rest of the chip; or the high-frequency-use semiconductor chip is provided with a small hole through which the ground line inside the semiconductor chip is connected to the ground surface on the back of the semiconductor chip. However, these techniques result in complicated manufacturing processes and higher cost.

As mentioned above, a further conventional technique exists whereby a plurality of bonding wires are connected in parallel to each other. However, such connection results in increased numbers of bonding pads on the chip and terminals (lead frame) of the package, which hinders further development for smaller chips and packages.

SUMMARY OF THE INVENTION

The present invention has an object to offer a compact, low-cost, and highly reliable high-frequency-use semiconductor device that especially boasts excellent high frequency properties with no increase in chip size and the like and no need to redesign the external terminals and the like of the high-frequency-use semiconductor chip, package, circuit substrate, and the like.

The semiconductor device in accordance with the present invention, in order to solve the foregoing problems, includes:

a high-frequency-use semiconductor chip including high frequency circuit blocks;

a circuit substrate on which the semiconductor chip is mounted; and electrical connect means each provided for electrically connecting one of the high frequency circuit blocks in the semiconductor chip to the circuit substrate, and is characterized in that the electrical connect means are provided such that a distance between first contacts at which the electrical connect means are connected to the respective high frequency circuit blocks is smaller than a distance between second contacts at which the electrical connect means are connected to the circuit substrate.

With the arrangement, the distance between the second contacts on the circuit substrate can be readily increased without a change in the positions of the first contacts at which the electrical connect means are connected to the high-frequency-use semiconductor chip, because the high-frequency-use semiconductor chip is typically smaller in size than the circuit substrate, that is, a package.

Hence, with the arrangement, the mutual inductance arising from the electrical connect means can be reduced by providing the electrical connect means so that the distance between the first contacts is smaller than the distance between the second contacts on the circuit substrate. Consequently, with the arrangement, the reduced mutual inductance enables an improvement on reliability, especially, at high frequencies.

In the semiconductor device, the electrical connect means are preferably for ground use. Generally, the mutual inductance arising from the electrical connect means is in some cases reducible by an externally connected matching circuit; however, when the electrical connect means are for ground use, it is difficult to reduce the mutual inductance using such a matching circuit.

By contrast, with the arrangement, even if each of the electrical connect means is for ground use, the mutual inductance arising from the electrical connect means can be reduced by providing the electrical connect means so that the distance between the first contacts is smaller than the distance between the second contacts on the circuit substrate.

As a result, with the arrangement, the reduction of the mutual inductance arising from the ground-use electrical connect means enables an improvement on reliability, especially, at high frequencies.

In the semiconductor device, the electrical connect means may be electrically conducting bonding wires. With this arrangement, since the bonding wires are ductile, i.e., pliable, the bonding wires as the electrical connect means are readily arranged so that the distance between the first contacts at which the bonding wires are connected to the respective circuit blocks that form an adjacent pair is smaller than the distance between the second contacts at which the bonding wires are connected to the substrate.

In the semiconductor device, a conductor set to a ground potential is preferably positioned between the electrical connect means that form an adjacent pair distances away from the electrical connect means. With the arrangement, the provision of the conductor set to a ground potential enables such specification that further reduces the mutual inductance.

In the semiconductor device, the conductor set to a ground potential is preferably an electrically conducting wire. With the arrangement, the ductility, i.e., pliability of the bonding wire facilitates establishment of electrical connection by the wire.

In the semiconductor device, the conductor set to a ground potential is preferably positioned substantially equal distances away from the electrical connect means that form an adjacent pair. With the arrangement, the provision of the conductor set to a ground potential midway between the electrical connect means that form an adjacent pair ensures the enabling of such specification that further reduces the mutual inductance.

The present invention will become more fully understood from the detailed description given hereinbelow and the accompanying drawings which are given by way of illustration only, are not in any way intended to limit the scope of the claims of the present invention.

BRIEF DESCRIPTION OF THE DRAWINGS

FIG. 1 is a plan view schematically showing a semiconductor device of a first embodiment in accordance with the present invention.

FIG. 2(a) and FIG. 2(b) are explanatory views showing a major part of the semiconductor device, FIG. 2(a) being a schematic cross-sectional view, FIG. 2(b) being a schematic plan view.

FIG. 4 is a graph showing the above-mentioned semiconductor devices having a successfully reduced inductance compared with conventional semiconductor devices.

DESCRIPTION OF THE EMBODIMENTS

Figure 3A:
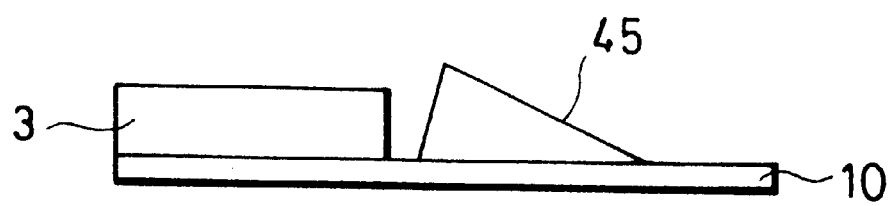
FIG. 3(a) and FIG. 3(b) are explanatory views schematically showing a semiconductor device of a second embodiment in accordance with the present invention, FIG. 3(a) being a schematic cross-sectional view, FIG. 3(b) being a schematic plan view.

Referring to FIGS. 1, 2(a), 2(b), 4, 7(a), and 7(b), the following will discuss a first embodiment in accordance with the present invention.

[Embodiment 1]

FIG. 1 schematically shows the first embodiment of the semiconductor device in accordance with the present invention. As shown in FIG. 1, the semiconductor device includes a package 11 as a circuit substrate and a substantially rectangular-parallelopiped-shaped high-frequency-use semiconductor chip 3 mounted and electrically connected to the package 11.

The semiconductor chip 3 has inside thereof, for example, an amplifier circuit 1 for high frequency amplification and an amplifier circuit 2 for high frequency amplification as high frequency circuit blocks. Here, an example is taken for the purpose of illustration only, where the semiconductor chip 3 includes the two amplifier circuits 1 and 2; however, the semiconductor chip 3 may include any number of amplifier circuits as long as the amplifier circuits are provided in plurality. Note that FIG. 1 shows only high-frequency-use bipolar transistors in the output stages, in lieu of the entirety of, the amplifier circuits 1 and 2.

In the semiconductor chip 3, an output bonding pad 7 for the amplifier circuit 1 and a ground-use bonding pad (first contact) 6 for the amplifier circuit 1 are formed side by side along a longitudinal side of the top surface of the semiconductor chip 3 and stick uncovered out of the top surface. The output bonding pad 7 is connected to, for example, the collector terminal of the high-frequency-use bipolar transistor, whereas the ground-use bonding pad 6 is connected to, for example, the emitter terminal of the high-frequency-use bipolar transistor.

Further, an input bonding pad 14 for the amplifier circuit 1 is formed on the other longitudinal side (the opposing longitudinal side to the foregoing longitudinal side) of the top surface of the semiconductor chip 3 and sticks uncovered out of the top surface.

In the semiconductor chip 3, similarly to the amplifier circuit 1, an output bonding pad 4 for the amplifier circuit 2, a ground-use bonding pad (first contact) 5 for the amplifier circuit 2, and an input bonding pad 16 for the amplifier circuit 2 are formed. The output bonding pad 4 is connected to, for example, the collector terminal of the high-frequency-use bipolar transistor, whereas the ground-use bonding pad 5 is connected to, for example, the emitter terminal of the high-frequency-use bipolar transistor.

The package 11 is provided with input and output terminals 15 and 12 for the amplifier circuit 1 and input and output terminals 17 and 13 for the amplifier circuit 2. The package 11 is further provided with a ground electrode 10 on the external surface of the package 11 that serves as a frame constituting a mount and support base for the semiconductor chip 3 and also as a ground surface.

Accordingly, the ground electrode 10 is specified to have a greater surface area than, preferably twice to thrice as great as, the bottom area of the semiconductor chip 3. The input terminals 15 and 17 and the output terminals 12 and 13 are disposed so as to surround the ground electrode 10. The semiconductor chip 3 is mounted on the ground electrode 10 so that the peripheral parts of the ground electrode 10 are exposed around the semiconductor chip 3. The bonding pads, terminals, and electrodes are all planar and made of a material with good conductance such as copper.

Bonding wires (electrical connect means) 20, 20', 18, 19, 8, and 9 made of wires of a metal with good conductance, such as gold, silver, copper, or aluminum are provided so as to electrically connect the bonding pads 14, 16, 7, 4, 6, and 5 of the amplifier circuits 1 and 2 in the semiconductor chip 3 to the terminals (lead frame) 15, 17, 12, 13, and 10 of the package 11. A metal with excellent ductility is selected to fabricate these bonding wires, so as to allow them to be bent freely with a small force.

Especially, the ground-use bonding wire 8 for the amplifier circuit 1 and the bonding wire 9 for the amplifier circuit 2, which are adjacent to each other, are bonded to the ground electrode 10 so that the distance between the bonding positions (second contacts) on the grounded frame for the package 11, i.e., the ground electrode 10, is large relative to the distance between the semiconductor chip 3 on the bonding pads 6 and 5.

To explain the connection in more detail, the bonding wires 8 and 9 are provided so as to extend from the semiconductor chip 3 to the ground electrode 10 of the package 11 in such a manner that the distance between the bonding wires 8 and 9 increases monotonically at a fixed rate toward the distal ends of the bonding wires 8 and 9.

The bonding wires 8 and 9 arranged in this fashion are preferred, because the foregoing distance can be efficiently increased by the symmetric positioning of the bonding wires 8 and 9 with respect to the surface that is perpendicular to a longitudinal side of the semiconductor chip 3 and that contains the midpoint between the bonding pads 6 and 5 on the semiconductor chip 3.

However, if this arrangement is not available, the bonding wires 8 and 9 may be arranged in alternative fashions. If one of the bonding wires 8 and 9 can extend only perpendicular to a side of the semiconductor chip 3, it is sufficient to arrange the other bonding wire so that the distance between the bonding wires 8 and 9 increases toward the ground electrode 10, albeit asymmetric. If both the bonding wires 8 and 9 extend diagonally at right or smaller angles to a side of the semiconductor chip 3, it is sufficient to arrange the bonding wires 8 and 9 so that the distance between them increases toward the ground electrode 10, albeit asymmetric.

In these situations, the greater the ratio of the distance on the ground electrode 10 to that on the semiconductor chip 3, the smaller the bonding coefficient, but the longer the bonding wires 8 and 9 become. As a result, the inductance actually grows in some cases with a relatively large ratio. Therefore, the optimum value of the ratio is satisfactorily specified according to the operating frequency, operating current, required characteristics, overall layout of the package 11, and wireless bonding rules, and preferably in the range of 1.2 to 3, more preferably in the range of 1.3 to 2.5, and most preferably in the range of 1.4 to 2.2.

The other bonding wires 18, 19, 20, and 20' may be arranged in parallel to the mutually adjacent ground-use bonding wires 8 and 9 or the signal-use bonding wires 18, 19, 20, 20', or may be bonded so as to extend from the bonding pads 14, 16, 7, 4 on the semiconductor chip 3 toward the terminals 15, 17, 12 and 13 respectively in such a manner that the distance between these bonding wires increases toward the distal ends thereof.

The circuits in the high-frequency-use the semiconductor chip 3 operate in the same manner as in the conventional technology explained earlier. The two amplifier circuits 1 and 2 are used under such conditions that the amplifier circuit 2 is turned off when the amplifier circuit 1 is in operation, and conversely, the amplifier circuit 1 is turned off when the amplifier circuit 2 is in operation.

Simulation was executed for the mutual inductance of the adjacent ground-use bonding wires 8 and 9 using an existing (commercially available) electromagnetic simulator in accordance with the present invention. Results will be given in the following.

FIG. 2(a) is a side view showing the shape and other nature of the bonding wires used in the simulation. In FIG. 2(a), the bonding wires are shaped like a mound, as an example, by the use of a wireless bonding device.

To further explain the mound-like-shape by taking one of the two bonding wires as an example, the bonding wire 9 is constituted by three continuous portions: i.e., a rising portion 9a, a horizontal portion 9b, and a falling portion 9c. The rising portion 9a extends diagonally upward so as to be increasingly separated from the ground electrode 10. The horizontal portion 9b starts where the rising portion 9a ends, and extends horizontally, i.e., parallel to the surface of the ground electrode 10. The falling portion 9c starts where the horizontal portion 9b ends, extends diagonally downward, i.e. so as to be increasingly closer to the ground electrode 10. The three portions, when combined, extend the whole length from the 200 $\mu$m-high bonding pad 5 on the top surface of the semiconductor chip 3 to the bonding position of the ground electrode 10.

It is specified that the rising portion 9a rises, for example, 180 $\mu$m above the bonding pad 5 located on an edge of the semiconductor chip and is, when measured perpendicular to a side of the semiconductor chip 3, 25 $\mu$m long. It is also specified that the horizontal portion 9b is 75 $\mu$m long and that the falling portion 9c is 600 $\mu$m long and 380 $\mu$m (180 $\mu$m+200 $\mu$m) high.

FIG. 2(a) and FIG. 2(b) are simplified views showing characterizing parts of the semiconductor device of FIG. 1 in accordance with the present invention. As shown in FIG. 2(a) and FIG. 2(b), the bonding pads 5 and 6, fabricated from, for example, 90 $\mu$m by 90 $\mu$m ideal metal, were disposed on the surface of the semiconductor chip 3 containing a GaAs semiconductor substrate, interconnected with the frame-shaped ground electrode 10 by the ground-use bonding wires 8 and 9, so as to provide grounding to the amplifier circuits 1 and 2. For the purpose of facilitating computation, it was assumed that the bonding wires 8 and 9 were made from an elongated rectangular ideal metal having a width of 25 $\mu$m and no thickness. Besides, the frequency was set to 2 GHz.

Figure 7A:
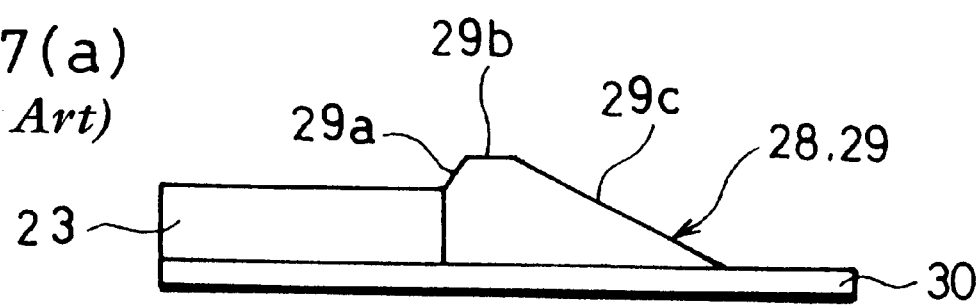
FIG. 7(a) and FIG. 7(b) are explanatory views showing a major part of a conventional semiconductor device for the purpose of comparison with those semiconductor devices in accordance with the present invention, FIG. 7(a) being a schematic cross-sectional view, FIG. 7(b) being a schematic plan view.
Figure 7B:
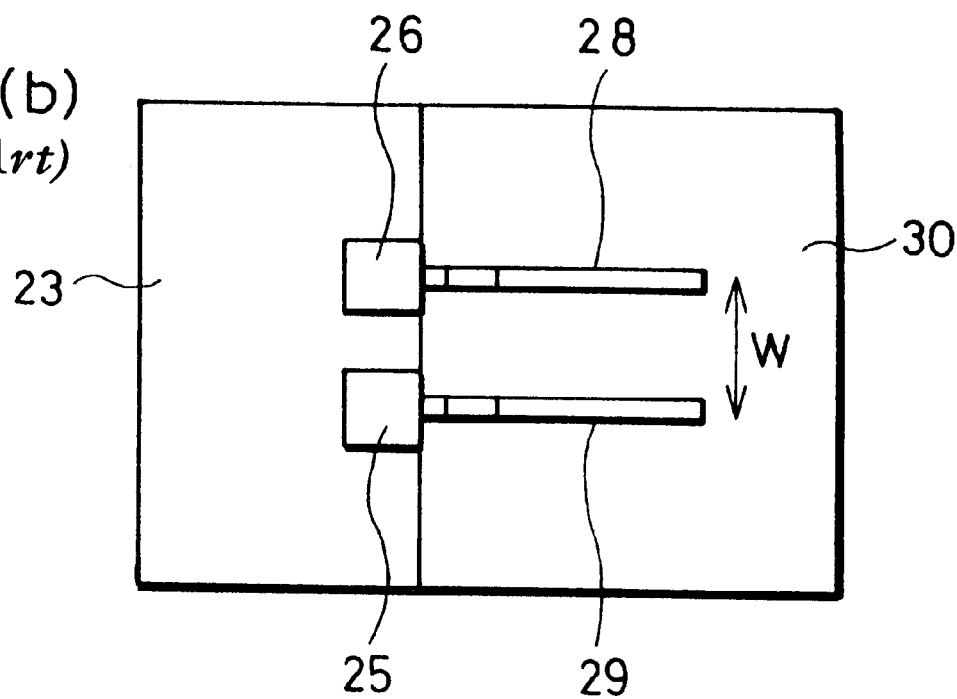

Bonding coefficients were determined from simulation involving two conventional ground-use bonding wires and two ground-use bonding wires in accordance with the present invention for comparative purposes. In conventional samples, as shown in FIG. 7(a) and FIG. 7(b), th e ground-use bonding wires 28 and 29 were positioned perpendicular to the high-frequency-use semiconductor chip 23 and parallel to each other. In samples in accordance with the present invention, the distance between the bonding positions on the ground electrode 10 was specified to be greater than the distance between the bonding pads 5 and 6 on the semiconductor chip 3.

In conventional samples, the distance between the bonding pads 26 and 25 to which the ground-use bonding wires 28 and 29 were connected respectively was specified to W. Also in the samples in accordance with the present invention, the distance between the bonding pads 6 and 5 to which the bonding wires 8 and 9 were connected respectively was specified to W so as to equal the distance between the bonding pads 26 and 25. FIG. 4 shows results of simulation in which the bonding pad distance W was varied so as to determine corresponding bonding coefficients K.

In FIG. 4, the "x"-signs and solid line represent conventional samples where the distance, W, between the bonding pads 26 and 25 was varied from 100 μm to 400 μm. As a result of this variation of the distance W, the bonding coefficient K varied from 0.245 to 0.03. It is understood that in the conventional samples, mutual inductance could be reduced in half by expanding the distance W between the bonding pads 26 and 25 from 140 μm to 250 μm.

However, according to the conventional technique, since the distance between the bonding pads 26 and 25 needs to be expanded, an increased number of pads inevitably requires a semiconductor chip 23 of a large size to accommodate the pads, which adds to the cost.

Now, in samples in accordance with the present invention, the bonding wires of the shape shown in FIG. 2(*a*) and FIG. 2(*b*) were employed, and the distance between the bonding pads 6 and 5 on the semiconductor chip 3 was specified to 140 μm. Specifically, the bonding wires 8 and 9 were disposed so as to extend 100 μm perpendicular to the semiconductor chip 3 and then extend further with an increasing distance between the bonding wires 8 and 9, before being bonded onto the ground electrode 10 at points 600 μm away from the bonding pads 6 and 5 when measured along a straight line. The distance between the bonding wires 8 and 9 on the ground electrode 10 was specified to 250 μm.

The bonding coefficient K between the two adjacent ground-use bonding wires 8 and 9 was determined to be about 0.09 as shown by a solid triangle "▲" in FIG. 4. From this, it is understood that isolation, i.e., a reduced mutual inductance arising from the bonding wires 8 and 9, which was equivalent to that in mounting by the conventional technique such that the distance between the parallel bonding wires 28 and 29 was increased to about 220 μm, was successfully achieved without expanding the distance between the bonding pads 6 and 5 on the semiconductor chip 3.

[Embodiment 2]

Figure 3B:
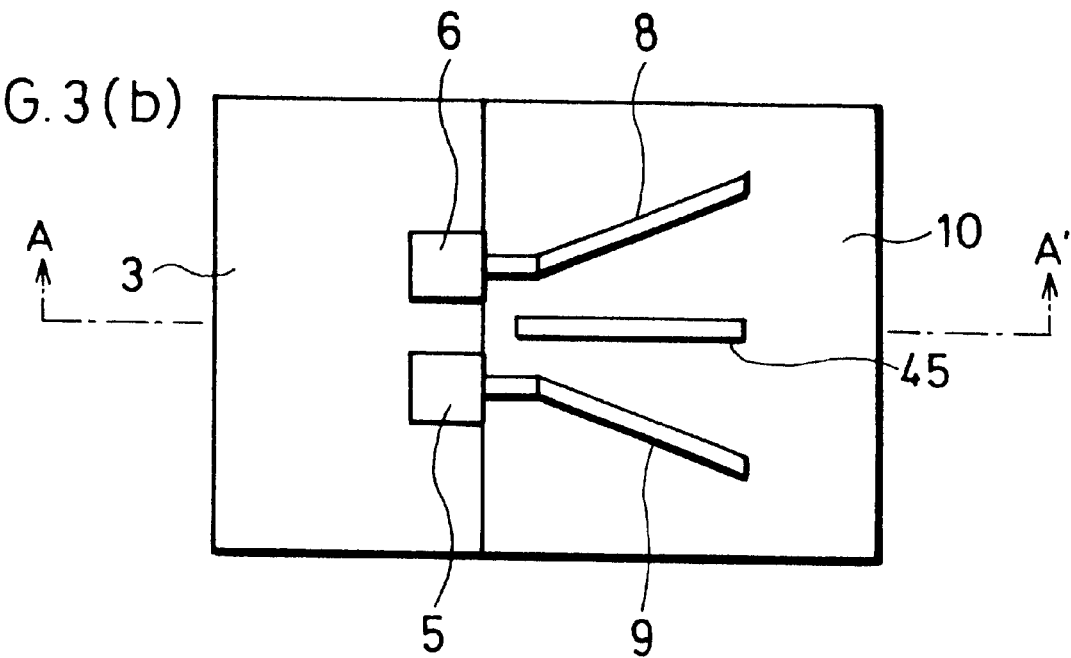
Figure 5:
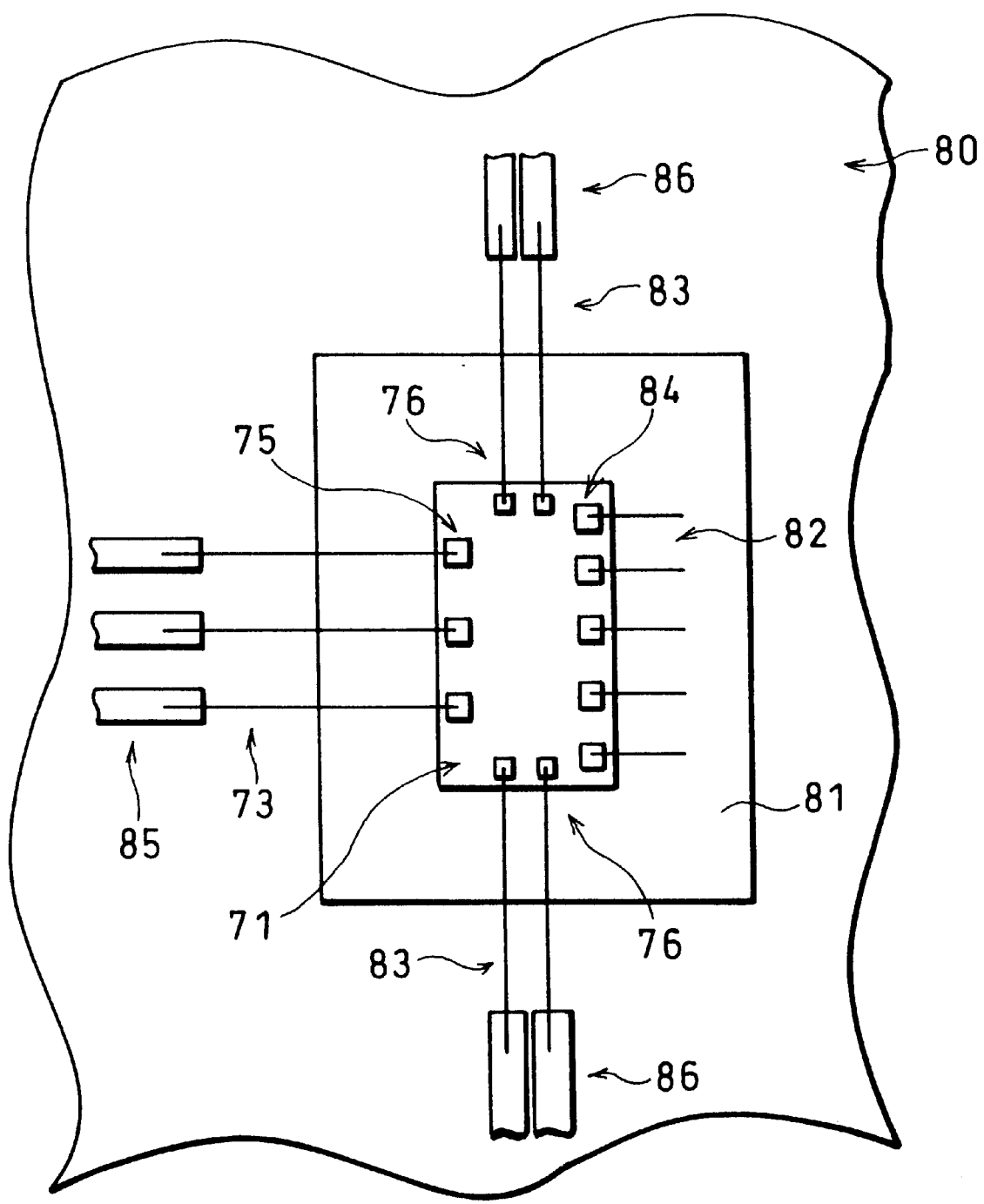
FIG. 5 is a plan view schematically showing a conventional semiconductor device.
Figure 6:
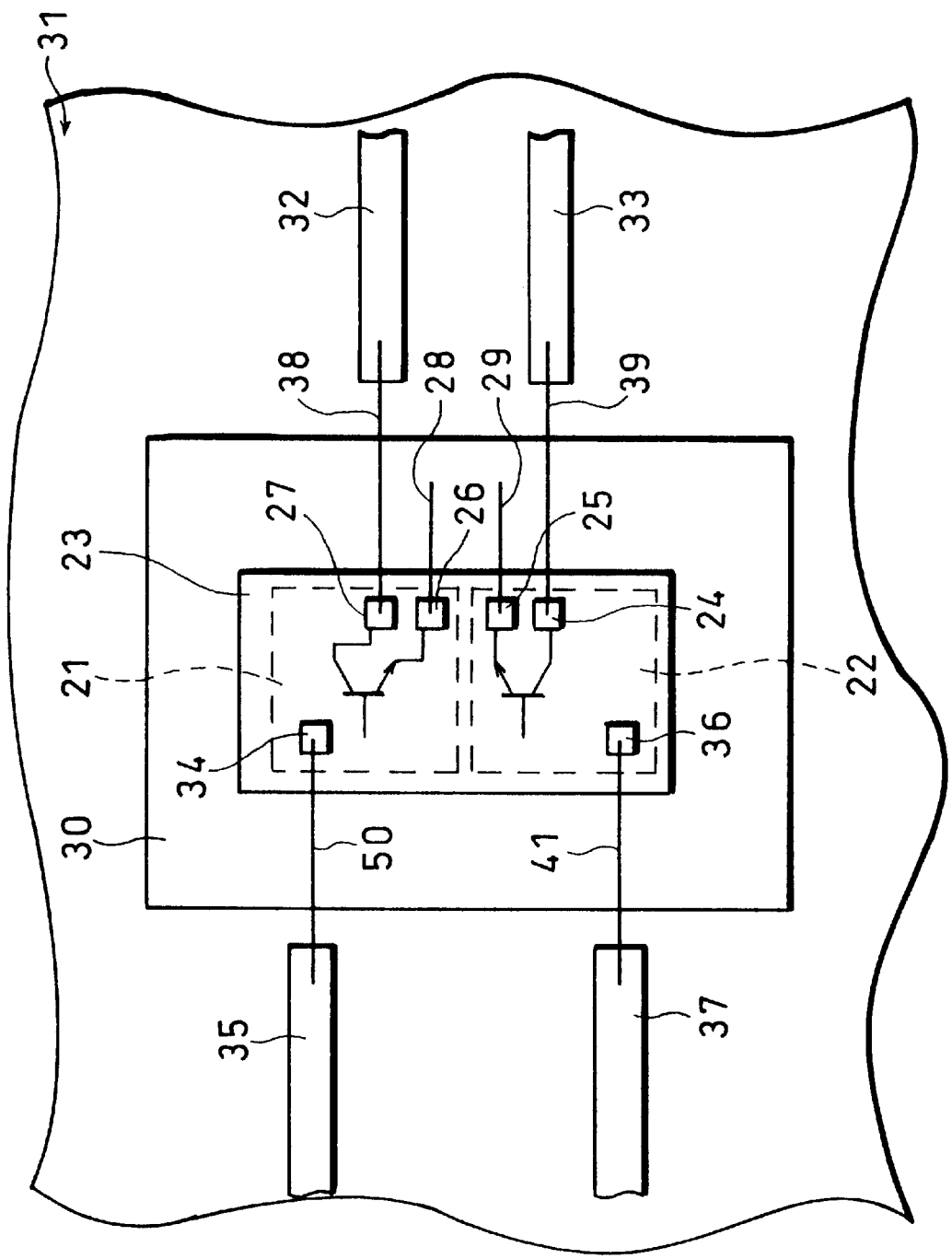
FIG. 6 is a plan view schematically showing another semiconductor device.

Referring to FIGS. 3(*a*), 3(*b*), and 4, the following will discuss a second embodiment of the semiconductor device in accordance with the present invention. Here, the arrangement of the circuits in the high-frequency-use the semiconductor chip 3 and the specifications of the bonding pads 6 and 5 are the same as in the aforementioned first embodiment, and description thereof is omitted.

In the present, second embodiment, a dummy wire (dummy conductor) 45 connected to the ground electrode 10 (set to a ground potential) but to none of the bonding pads 4, 5, 6, 7, 14, 16 on the semiconductor chip 3 is mounted by bonding midway between the bonding wires 8 and 9 in the empty space between the bonding wires 8 and 9 of the first embodiment (see FIG. 2(*a*) and FIG. 2(*b*)).

The dummy wire 45 is positioned distances away from the two ground-use bonding wires 8 and 9, more preferably, substantially midway between the bonding wires 8 and 9 (substantially equal distances away from the bonding wires 8 and 9), in other words, on a plane which is perpendicular to a longitudinal side of the semiconductor chip 3 and which contains the midpoint between the bonding pads 6 and 5 on the semiconductor chip 3.

Further, in the present form of simulation, the dummy wire 45 is specified to have the same height with the ground-use bonding wires 8 and 9 and the same length with the bonding wires 8 and 9 extending from the semiconductor chip 3 to the ground electrode 10, the length being measured along a straight line.

In the present, second embodiment, the two ground-use bonding wires 8 and 9 are provided so as to extend to the ground electrode 10 in such a manner that the distance between the bonding wires 8 and 9 steadily increases starting at their proximal ends (the ends attached to the semiconductor chip 3) to their distal ends (the ends attached to the ground electrode 10). This results in expansion of the empty space between the bonding wires 8 and 9, which facilitates the mounting of the dummy wire 45 to the ground electrode 10 in that empty space.

The solid square "■" in FIG. 4 represents effects of the provision of the dummy wire 45 as determined by simulation. The two ground-use bonding wires 8 and 9 are mounted according to the same specifications as in the first embodiment.

In the second embodiment, as shown in FIG. 4, the provision of the dummy wire 45 caused the bonding coefficient K representative of the mutual inductance arising from the bonding wires 8 and 9 to equal about 0.075. It is understood that isolation, i.e., a reduced mutual inductance of the bonding wires 8 and 9, which was equivalent to that in mounting by the conventional technique such that the distance between the parallel bonding wires 28 and 29 was increased to about 270 μm, was successfully achieved.

In the second embodiment so far, the description focused on the provision of the dummy wire 45 as an example. Alternatively, other conductors may be provided in the same manner to replace the dummy wire 45, and still produce the same effects as those described above. It will be obvious that the present invention is by no means limited by the foregoing first and second embodiments, and may vary in many ways. Such variations are not to be regarded as a departure from the spirit and scope of the invention, and all such modifications as would be obvious to one skilled in the art are intended to be included within the scope of the following claims.

Apart from those cases where the bonding wires 8 and 9 are both used to provide grounding to the amplifier circuits 1 and 2 that are integrated in a single chip as in the first and second embodiments, the present invention is still applicable to circuitry in which both of the bonding wires are used to carry signals (including bonding wires used for any purpose including power supply, except for the provision of grounding), and also to circuitry in which one of the bonding wires is used for grounding and the other for carrying signals.

It will be obvious that apart from the mounting of bonding wires extending from the bonding pads on the semiconductor chip 3 to the terminals (lead frame) of a package, the same technique is applicable to wireless bonding to terminals on the circuit substrate with similar effects.

The present invention is most effectively applied to the semiconductor chip 3 containing the amplifier circuit 1 producing a gain in high frequency range (higher than 1 MHz, more preferably from 100 MHz to 100 GHz). However, the present invention is applicable in mounting of any kind of high-frequency-use semiconductor elements that requires a reduced level of interference.

The description so far focused on an application, as an example, where the high-frequency-use semiconductor chip 3 was mounted with its top surface upward and electrically connected to the terminals (lead frame) of the package 11 or the circuit substrate by bonding wires. Alternatively, the present invention produces similar effects when applied in mounting of a high-frequency-use semiconductor chip to the package in an upside-down position after formation of bumps at the terminals of the high-frequency-use semiconductor chip, by extending the internal package wiring and substrate wiring to the exterior to the high-frequency-use semiconductor chip through its terminals and expanding the distances between wires.

As discussed in detail in the foregoing, the present invention successfully realizes highly reliable operation of the semiconductor chip 3, especially, at high frequencies through reduction in the mutual inductance arising from, for example, the bonding wires 8 and 9 as the electrical connect means that form an adjacent pair with no increase in size of the semiconductor chip 3, by, when electrically connecting the high-frequency-use the semiconductor chip 3 to the package 11 or the substrate, specifying the distance between the terminals on the semiconductor chip 3 as being smaller than the distance between the terminals of the package 11 or the substrate.

Besides, the present invention successfully achieves a further reduction in the mutual inductance by providing a ground-potential-connected dummy wire 45 substantially midway between, for example, the bonding wires 8 and 9 as the electrical connect means that form an adjacent pair.

In addition, the bonding wires 8 and 9, as well as the dummy wire 45, can be installed using an existing bonding device, and thereby no extra cost is needed. Further, the present invention requires no customized processing in contrast to the foregoing example where a concave portion is formed in the die bond section to mechanically reduce the wire length, thereby effecting the same advantages at lower cost by far. However, when employed in combination with this method of mechanically reducing the wire length, the present invention can obviously further reduce the inductance.

Incidentally, to obtain a great output power despite the recently prevalent, reduced drive voltage, the power amplifiers as the amplifier circuits 1 and 2 need to be designed so as to possess a reduced output impedance, in other words, produce an increased current amplitude, from the transistor in the output stage. Since the effects of the mutual inductance grow in direct proportion to the magnitude of current variation, when the current amplitude needs to be specified to a great value as in the power amplifiers above, the present invention can achieve especially large effects.

As discussed earlier, the present invention is capable of reducing the inductance, and especially so in such applications that high frequency electric waves (for example, waves in a 1 GHz to 10 GHz range) are employed where the inductance arising from the ground electrode 10 as a ground line becomes a major factor to degrade the overall performance of the amplifier circuits 1 and 2. Therefore, the present invention is very useful in the utilization of high frequency electric waves in, for example, cellular phones.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a high-frequency-use semiconductor chip including high frequency circuit blocks situated adjacent to each other;
   a circuit substrate on which the semiconductor chip is mounted; and
   electrical connect means each provided for electrically connecting one of the high frequency circuit blocks in the semiconductor chip to the circuit substrate,
   wherein the electrical connect means situated adjacent to each other are provided such that the ratio of a distance between second contacts at which the electrical connect means are connected to the circuit substrate to a distance between first contacts at which the electrical connect means are connected to the respective high frequency circuit blocks is in the range of 1.2 to 3.

2. The semiconductor device as set forth in claim 1, wherein
   the electrical connect means are used to provide grounding.

3. The semiconductor device as set forth in claim 1, wherein
   the electrical connect means are electrically conducting bonding wires.

4. The semiconductor device as set forth in claim 1, wherein the distance between the second contacts is 1.3 to 2.5 times that between the first contacts.

5. The semiconductor device as set forth in claim 1, wherein the distance between the second contacts is 1.4 to 2.2 times that between the first contacts.

6. The semiconductor device as set forth in claim 1, wherein
   the electrical connect means are provided such that the distance between the electrical connect means increases starting at the first contacts toward the second contacts.

7. The secmiconductor device as set forth in claim 1, wherein the electrical connect means are provided such that the distance between the electrical connect means monotonically increases starting at the first contacts toward the second contacts.

8. The semiconductor device as set forth in claim 1, wherein
   the electrical connect means are provided such that the distance between the electrical connect means increases starting at the first contacts toward the second contacts at a fixed rate.

9. The semiconductor device as set forth in claim 1, wherein
   the circuit substrate includes a ground electrode serving as the second contacts for the electrical connect means.

10. The semiconductor device as set forth in claim 9, wherein
    the semiconductor chip is mounted on the ground electrode.

11. The semiconductor device as set forth in claim 10, wherein
    the ground electrode has a surface area greater than a bottom area of the semiconductor chip.

12. The semiconductor device as set forth in claim 1, wherein
    an adjacent pair of the electrical connect means are provided so as to be symmetric with respect to a virtual plane crossing the circuit substrate where the second contacts are disposed.

13. The semiconductor device as set forth in claim 12, wherein
    the virtual symmetric plane crosses the circuit substrate at substantially right angles.

14. The semiconductor device as set forth in claim 1, wherein
    a dummy conductor set to a ground potential is positioned between the electrical connect means.

15. The semiconductor device as set forth in claim 14, wherein the dummy conductor is an electrically conducting wire.

16. The semiconductor device as set forth in claim 14, wherein
the dummy conductor is positioned substantially equal distances away from the electrical connect means that form an adjacent pair.

17. The semiconductor device as set forth in claim 14, wherein
the dummy conductor is positioned midway between the electrical connect means that form an adjacent pair.

18. The semiconductor device as set forth in claim 1, wherein
at least one of the high frequency circuit blocks includes an amplifier circuit having a gain at 1 MHz or higher frequencies.

19. The semiconductor device as set forth in claim 1, wherein
the high frequency circuit blocks operate alternately.

20. The semiconductor device as set forth in claim 1, wherein
the first contacts are situated adjacent to each other and the distance therebetween is about 100 micrometers to 400 micrometers.

21. The semiconductor device as set forth in claim 2, wherein
the high frequency circuit blocks have respective signal-use bonds; and
the signal-use bonds are situated so as to sandwich the ground-use electrical connect means.

22. A semiconductor device comprising:
a chip mounted on a circuit substrate, the chip comprising adjacent first and second high frequency circuit blocks;
a first bonding wire connecting a contact on the first high-frequency circuit block to the circuit substrate; and
a second bonding wire, adjacent to the first bonding wire, connecting a contact on the second high-frequency circuit block to the circuit substrate,
wherein the ratio of the distance between the ends of the first and second bonding wires connected to the circuit substrate to the distance between the ends of the first and second bonding wires connected to the respective contacts of the high-frequency circuit blocks is in the range of 1.2 to 3.

23. The semiconductor device as set forth in claim 22, wherein the first and second high-frequency circuit blocks each comprises an amplifier circuit.

24. The semiconductor device as set forth in claim 22, wherein the first and second bonding wires are ground wires.

25. The semiconductor device as set forth in claim 22, wherein the first and second bonding wires are signal wires.

26. The semiconductor device as set forth in claim 22, wherein the ratio is in the range of 1.3 to 2.5.

27. The semiconductor device as set forth in claim 22, wherein the ratio is in the range of 1.4 to 2.2.

28. The semiconductor device as set forth in claim 22, further comprising:
a third bonding wire connecting to a contact on the first high-frequency circuit block and extending in parallel to the first bonding wire; and
a fourth bonding wire connecting to a contact on the second high-frequency circuit block and extending in parallel to the second bonding wire.

29. The semiconductor device as set forth in claim 22, wherein the third and fourth bonding wires are signal wires.

30. The semiconductor device as set forth in claim 22, further comprising:
a dummy wire disposed between the first and second bonding wires.

31. The semiconductor device as set forth in claim 30, wherein the dummy wire is disposed at substantially equal distances from both the first and second bonding wires.

32. The semiconductor device as set forth in claim 30, wherein both ends of the dummy wire are connected to the circuit substrate.

33. The semiconductor device as set forth in claim 30, wherein the dummy wire and the first and second bonding wires all have the same straight-line length.

34. The semiconductor device as set forth in claim 22, wherein the first bonding wire extends perpendicularly from a side of the first high-frequency circuit block and the second bonding wire extends non-perpendicularly from a corresponding side of the second high-frequency circuit block.

35. The semiconductor device as set forth in claim 22, wherein the first bonding wire extends non-perpendicularly from a side of the first high-frequency circuit block and the second bonding wire extends non-perpendicularly from a corresponding side of the second high-frequency circuit block.

36. The semiconductor device as set forth in claim 22, wherein the adjacent first and second high-frequency circuit blocks operate alternately.

* * * * *